US006625770B1

(12) United States Patent
Schultz (10) Patent No.: US 6,625,770 B1
(45) Date of Patent: Sep. 23, 2003

(54) METHOD OF AUTOMATICALLY GENERATING SCHEMATIC AND WAVEFORM DIAGRAMS FOR RELEVANT LOGIC CELLS OF A CIRCUIT USING INPUT SIGNAL PREDICTORS AND TRANSITION TIMES

(75) Inventor: Richard T. Schultz, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 561 days.

(21) Appl. No.: 09/597,433

(22) Filed: Jun. 20, 2000

(51) Int. Cl.$^7$ ............................. G01R 31/28; G06F 11/00
(52) U.S. Cl. .............................. 714/741; 702/67; 716/6; 703/15
(58) Field of Search .................................. 714/741, 724, 714/25, 37, 39, 45; 703/15, 16, 13, 14; 716/5, 12, 1, 4; 702/118, 125, 66–67, 73

(56) References Cited

U.S. PATENT DOCUMENTS

| | | | |
|---|---|---|---|
| 4,792,913 A | * 12/1988 | Buckland et al. ............... | 708/3 |
| 4,924,429 A | * 5/1990 | Kurashita et al. .............. | 703/15 |
| 4,964,125 A | * 10/1990 | Kim ............................. | 714/26 |
| 5,105,374 A | * 4/1992 | Yoshida ........................ | 703/14 |
| 5,184,308 A | * 2/1993 | Nagai et al. ................... | 703/15 |
| 5,272,704 A | * 12/1993 | Tong et al. .................... | 714/26 |
| 5,426,770 A | * 6/1995 | Nuber .......................... | 703/15 |
| 5,548,714 A | * 8/1996 | Becker ......................... | 714/26 |
| 6,301,685 B1 | * 10/2001 | Shigeta ......................... | 714/799 |
| 6,401,219 B1 | * 6/2002 | Shigeta ......................... | 714/26 |

OTHER PUBLICATIONS

IEEE Std 1364–1995: IEEE Standard Harware Description Language Based on Verilog Hardware Description Language, IEEE, Oct. 14, 1996, pp. 207–218.*

Samir Palnitkar, Verilog HDL: A Guide to Digital Design and Synthesis, Prentice Hall, 1996, p. 185.*

EE 240 course notes [online], Oct. 1999 [retrieved on Jan. 13, 2003]. Retrieved from the Internet: URL:http://web.archive.org/web/19991023073515/http://www.ece.cmu.edu/~ee240/LABS/lab2a.pdf>.*

Cook, A First Course in Digital Electronics, Prentice Hall 1999, pp. 330–331.*

DAI Signalscan User's Guide, Design Acceleration Inc., Feb. 12, 1999.*

"Netlist Design Analyzer", Jan. 23, 1997, Concept Engineering GmbH, Version 2.6.*

* cited by examiner

Primary Examiner—Albert Decady
Assistant Examiner—Guy Lamarre
(74) Attorney, Agent, or Firm—John H. Ley, LLP (57) ABSTRACT

Relevant logic cells and waveforms of a circuit are automatically identified, traced and displayed by using conventional simulation, schematic viewing and waveform viewing tools. The input and output waveforms to and from each logic cell and a transition and a transition time point of each waveform are derived. The output waveform and a selected transition time point identify a predictive input waveform and its transition time, which cause the output signal transition at the selected transition time point. The predictive input signal is the output signal of a preceding, predictive logic cell, thereby identifying the preceding predictive logic cell. Repetitions of this procedure are performed with each new identified predictive logic cell to automatically derive a series or cone of logic cells which cause the desired output signal at a selected output signal transition time.

28 Claims, 6 Drawing Sheets

FIG._3A A-input

FIG._3B B-input

FIG._3C X-output

| Output State Change | Output Transition Time (ps) | Input Predictor Transition Time (ps) | Input Predictor |
|---|---|---|---|
| I$290(X) | 0 | 0 | I$290(A) |
| I$290(0) | 150 | 50 | I$290(B) |
| I$290(1) | 300 | 200 | I$290(A) |
| I$290(0) | 450 | 350 | I$290(A) |
| I$290(1) | 900 | 800 | I$290(B) |
| I$290(0) | 1350 | 1250 | I$290(A) |

METHOD OF AUTOMATICALLY GENERATING SCHEMATIC AND WAVEFORM DIAGRAMS FOR RELEVANT LOGIC CELLS OF A CIRCUIT USING INPUT SIGNAL PREDICTORS AND TRANSITION TIMES

The present invention relates to methods for analyzing integrated circuits (ICs) during design of the ICs or during failure analysis of those ICs during development. More particularly, present invention relates to a new and improved method of using new information derived from using an existing Verilog circuit simulation tool to develop input prediction information. The input prediction information is thereafter used in conjunction with an existing netlist definition of the circuit to define a cone or rearward extending group of only the relevant circuit components or cells of the IC which cause a particular output signal at a predetermined output signal transition time. Analysis of the IC is facilitated by reducing the amount of time and the tedium required for tracing the circuit in design and failure circumstances.

BACKGROUND OF THE INVENTION

Most modern semiconductor integrated circuits (ICs) are extremely complex in the number and interconnection of their components or cells. The complexity results from a number of trends in modern electronics. For example, the continual miniaturization of ICs allows more functional cells to be placed on the same sized chip for essentially no additional cost. The cost of an IC is generally related only to the physical size of the substrate upon which the IC is formed and not to the number of components of the IC. Therefore, the effort is to include more cells and functionality in each new IC. The trend in electronics has also been toward integrating entire systems into a single chip, or at least toward integrating larger portions of entire systems into single chips. Such ICs are called application-specific integrated circuits (ASICs) or system level integrated circuits (SLICs).

Fabricating a modern, complex IC, such as an ASIC or SLIC, is also a complicated task. The fabrication involves designing the schematic circuitry by using specific cells and connecting them in certain manner, and then simulating the functionality of the schematic circuitry to determine whether the circuitry meets the desired functionality. The design and the simulation are so complex that both functions are generally performed by computer programs or tools designed for those specific purposes. For example, the circuit itself is designed by the use of a behavioral level language, which defines the all of cells in the circuit and their connectivity, and in doing so creates a file known as a netlist which describes those cells and their connectivity. A schematic viewing tool obtains information from the netlist to create a visual display of the circuit and its components. To test the functionality of the circuit, a Verilog simulation program is used. The Verilog simulation program refers to the netlist and additional information which defines the logical function and time delays and other functional factors associated with each of the cells, and develops output state change signals and output transition times for each of the cells in response to a specific input signal. The output state change signals and the output transition times for each of the cells is thereafter displayed by the use of a waveform viewing tool. The waveform viewing tool makes use of the output state change and transition time information derived from the Verilog simulation program to create a display of the waveforms existing at each of the cells in the circuit. The use of behavioral level language circuit synthesis tools and Verilog simulation tools is well-known.

The design and fabrication a semiconductor chip is very complex and usually requires a relatively long period of time, typically measured in months or years to complete. Like any other complex procedure, mistakes or anomalies may arise and prevent proper functionality. Any anomalies arising from fabrication, circuit design errors and oversights, and functional or logic errors must identified and corrected before the semiconductor chip is released for commercial use. The phase of the overall fabrication procedure during which these oversights and anomalies are identified and corrected is referred to as the "debug" stage. It is essential that the design errors and fabrication anomalies be identified and corrected during the debug stage, because otherwise the IC will not achieve its intended functionality. Furthermore, until the errors are identified and understood, corrections may need to be made in the circuit design, the connectivity of the logic cells and/or the fabrication process, to eliminate the defects.

To identify the errors during the debug stage, it is typical to use testers which generate particular signals and combinations of signals that are applied to the fabricated IC, and to measure the response of the IC to these input stimulus signals. The responses are measured both at the output of the IC and internally at different connection points or nodes between the cells. The internal measurements are obtained either by the use of a mechanical probe which physically contacts a, node or by an electron beam device which projects an electron beam onto the node and derives an electrical signal from the electron beam. The signals derived from the actual IC are then compared to the computer tool-simulated signals at the comparable nodes of the simulated schematic circuit. If there is a discrepancy, that discrepancy indicates a problem in the fabrication or design of the IC. Thus, the typical previous approach to identifying the errors is to first obtain the actually-measured signals from the IC under the conditions which create the error, and then compare the actually-measured signals to the signals generated from a waveform simulation based on the circuit schematic.

The large number of very small cells within the typical IC complicates the task of tracing the signal within the IC. The task is made even more difficult by the difficulty in locating particular nodes and cells among the hundreds or thousands of such nodes and cells in a typical IC. Moreover, the task can be further complicated if the engineer or technician who is involved in conducting the tests did not design the circuit. Under such circumstances the test engineer is not as familiar with the circuit design as the design engineer, which further complicates the task and increases the possibility of further inadvertent errors.

Moreover, the complexity arising from the number and connectivity of the cells makes it a very time-consuming task to debug the IC. The debug process begins by identifying the particular circumstances or combination of input signals which create the error. The error is manifested in an erroneous output signal delivered from an output pad of the IC. Knowing the output error signal allows the test engineer to work backward into the preceding logic cells within the IC in an orderly, step-by-step manner to attempt to locate the cells or nodes within the IC which give rise to the error. The error may be caused by any of a series of components through which the preceding signals pass to influence the later-occurring signals and the output signals. Thus, viewed from the rear of the circuit looking forward into the preceding logic cells and nodes of the IC, there is an ever expanding segment or "cone" of logic cells which are possible candidates for generating the error.

To trace a cone of logic cells, it is typical to trace the circuit schematic diagram and identify the logic cells which may have created the error. The tracing occurs manually, by employing mental steps used by the test and debug engineer, aided by the circuit diagram and waveform diagrams presented by the schematic viewing and waveform viewing tools. After identifying the logic cells and connection nodes of those logic cells, the output signal from each of the relevant logic cells is manually obtained from the comparable nodes and cells on the fabricated IC. After obtaining the measured signals, they are compared to the simulated signals. Any discrepancy points to the cause of the error. The complexity of the circuit prevents any other logical approach to identifying the errors, other than working backwards manually in a step-step-manner.

Days of time could be consumed in tracing the schematic diagram to identify the relevant components, collecting the measured signals from the IC, understanding the functionality of the circuit, and comparing the measured signals to the simulated signals. The task was complicated when the test engineer did not possess the same familiarity with the circuit schematic as did the original circuit designer. Such a circumstance sometimes occurs because of changes in personnel during the long time which can elapse between the circuit design phase of the IC and the fabrication phase of the IC. Furthermore, because of the complexity involved in the circuit and the necessity to use a manual, methodical and step-by-step approach to tracing the signals backwards through the circuit, it has been unproductive to guess or speculate as to the cause of an error without undertaking the step-by-step, methodical analysis. The number of components involved simply prevented any worthwhile shortcuts.

It is with respect to these and other considerations relevant to understanding the operation of debugging a modern IC that have given rise to the present invention.

SUMMARY OF THE INVENTION

One aspect of the present invention relates to a new and improved methodology for quickly identifying only those logic cells and their connectivity points or nodes within the IC which are relevant to the functionality or an error in the IC, which may arise at a particular instance of time during operation of the IC. As a result, a test engineer who is not thoroughly familiar with the circuit design is more competent to efficiently identify potential errors in logic cells and their connection nodes. Another aspect of the present invention allows particular logic cells and their connection nodes to be rapidly and automatically identified as a rearwardly-expanding group or cone of logic cells. Identifying a cone of logic cells and their connectivity in this manner avoids the problems of the test engineer manually and mentally making decisions based on the circuit schematic, and also allows the test engineer to skip or leapfrog levels of logic in an attempt to locate the error without methodically testing each of the logic cells and nodes in a manual, step-by-step, rearward manner. This feature minimizes the number of logic cells which must be considered, reduces the amount of time required for debugging or understanding the circuit, and reduces the tedium of tracing the logic cells and nodes backward in the schematic while minimizing the risks of errors resulting from the manual tracing process itself. Moreover, by quickly identifying the cone of logic cells and nodes which are relevant to the failure or error, it is not necessary to collect the actually-measured signals at each stage or level of cells and nodes. Only those signals at selected points need be obtained and compared to the simulated waveforms. Thus, the actual number of steps involved in debugging and understanding the circuit are potentially reduced. In general, the present invention facilitates a more rapid and efficient analysis of new semiconductor chips and circuits, and does so under circumstances where an extensive knowledge of the underlying circuit design is not required for efficient analysis.

To achieve these and other aspects, the present invention involves a method of identifying and displaying relevant ones of a plurality of connected logic cells and waveforms from the logic cells of a circuit. The method makes use of a circuit simulation tool to describe input and output waveforms to and from each logic cell and a transition of the waveforms and a transition time point when the transition occurs in each waveform. The steps of the method comprise selecting the output waveform and a transition time point of the selected output waveform delivered from a selected logic cell, identifying a predictive input waveform and a transition time of the predictive input waveform to the selected logic cell which causes the transition of the output signal from the selected logic cell at the selected transition time, and identifying a predictive logic cell connected to the selected logic cell which supplies the output waveform to the selected logic cell which constitutes the predictive input waveform previously identified. At least one new repetition of these three steps is performed under circumstances where the predictive logic cell identified in a previous repetition becomes the selected logic cell for the new repetition and the transition time point of the predictive input waveform to the selected logic cell of the previous repetition becomes the selected transition time of the output waveform of the selected logic cell for the new repetition.

Other preferred aspects and steps of the method of the present invention relate to displaying a schematic diagram of the selected and predictive logic cells identified from all of the repetitions, and displaying the input and output waveforms of the selected and predictive logic cells identified from the all of the repetitions, preferably by using a conventional schematic viewing tool and a conventional waveform viewing tool. The displayed schematic diagrams and waveform simulations are analyzed to gain an understanding of the circuit, and to identify defects in a practical embodiment of the circuit by comparing the actually measured signals to the simulated waveforms at the locations identified by the displayed schematic diagram.

The method also preferably relates to creating information describing the logic cells of the circuit by using information describing output waveforms from the logic cellsdescribed by the simulation tool. The information preferably describes the state of the output waveform at each output waveform transition and the time point of the output waveform transition for each logic cell, time delay information of the time delay between the occurrence of the predictive input waveform and the transition of the output waveform for each logic cell, the predictive input waveform and the transition time point of the predictive input waveform. The latter two items of information, and input predictor signal and an input predictor signal transition time, are preferably identified from the information describing the state of the output waveform at each output waveform transition and the time point of the output waveform transition for each logic cell, the time delay information associated with each selected and predictive logic cell, and the information describing the circuit.

Other preferred aspects of the present method involve selecting the number of repetitions, performing repetitions until the predictor input waveform is identified as a stimulus input waveform applied to the simulation tool, and performing repetitions until the identified predictive logic cell is a beginning logic cell of the circuit.

A further preferred aspect of the invention identifies the predictive input waveform as a synchronous waveform, such as a clock waveform. As a part of defining a cone of connected predictive and selected logic cells by performing the repetitions, the cone may include a sub-part which involves a synchronous logic cell which causes a synchronous waveform. In such a case, the the same type of repetitions are performed to define the sub-part of the cone.

Accomplishing the steps allows a chain or cone of logic cells to be identified automatically by using the input predictor signal, the input predictor signal transition time, the output state change signal and the output state change signal transition time. This information identifies the relevant ones or a cone of logic cells which are responsible for causing the output waveform transition at the selected time. The schematic and waveform viewing tools utilize this information to assemble the relevant schematic diagrams and waveform simulations. This assembled information facilitates a rapid and clear understanding of the functionality of the relevant logic cells, thereby avoiding the manual and time-consuming effort of individually identifying each logic cell by tracing through the schematic diagram, evaluating the waveform diagrams, and determining the next relevant logic cell in a series as a result of the waveform diagram evaluation. Instead, the automatic nature of the present invention rapidly displays the relevant logic cells and their simulated waveforms, thereby allowing the circuit analyst to focus on understanding circuit functionality rather than risking the diversion of a complete understanding of the circuit caused by manual tracing activities.

A more complete appreciation of the present invention and its scope may be obtained from the accompanying drawings, which are briefly summarized below, from the following detailed descriptions of presently preferred embodiments of the invention, and from the appended claims.

DETAILED DESCRIPTION

Figure 1:
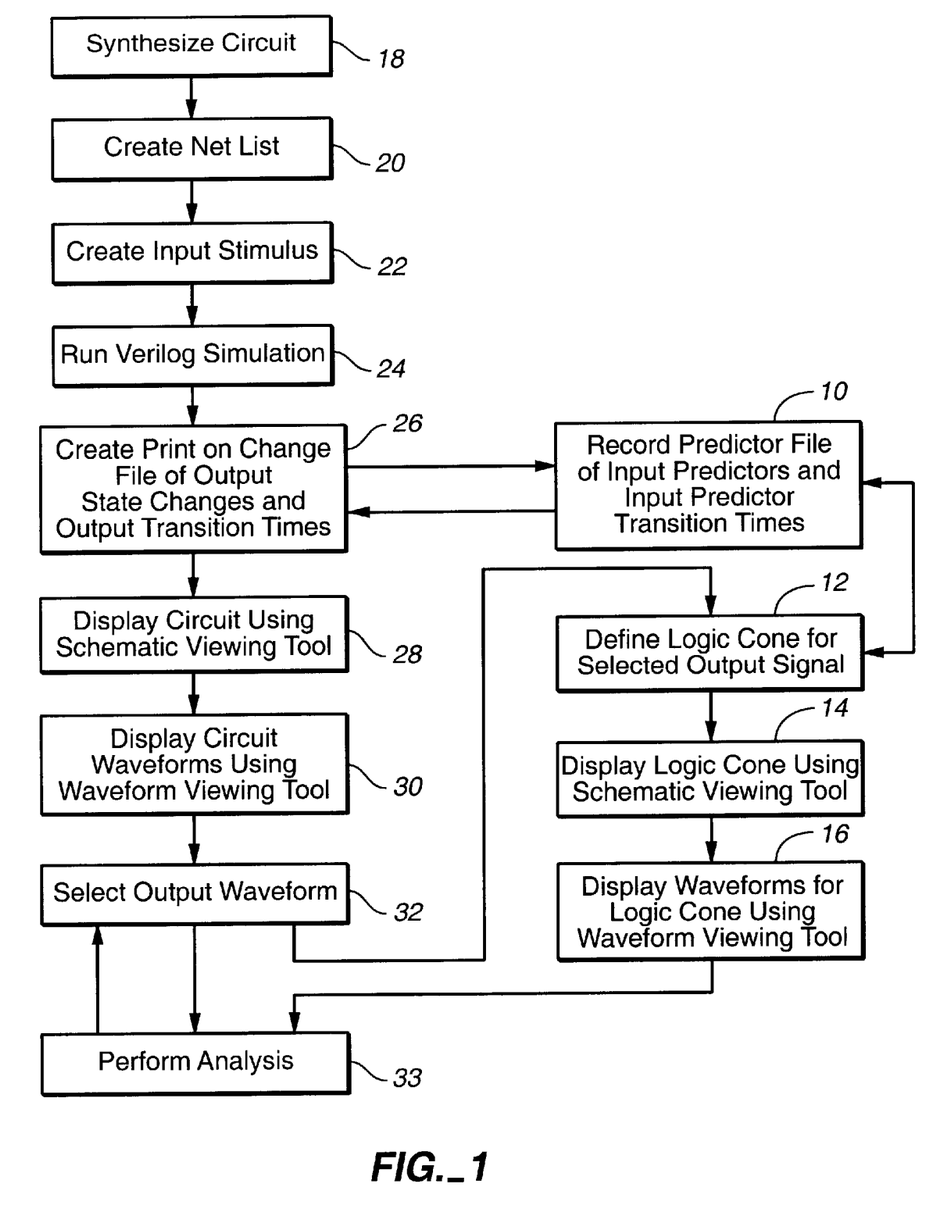
FIG. 1 is a general flowchart of the basic steps involved in the method of the present invention interrelated to other conventional steps of creating and simulating the functionality of a circuit using conventional schematic viewing, waveform viewing and simulation tools.

The basic methodology of the present invention is illustrated by steps 10, 12, 14 and 16, shown in FIG. 1. The present invention depends on and interacts the conventional steps involved in circuit synthesis, waveform simulation of the synthesize circuit, and analysis of the circuit and its waveforms, as shown at steps 18, 20, 22, 24, 26, 28, 30, 32, and 33. In performing these conventional steps, and in performing the steps of the present invention, a conventional circuit synthesizing program or tool, which employs a well-known behavioral level language, is employed at step 18 to create the netlist which occurs at step 20. Similarly, a conventional simulation program or tool, which employs a well-known language such as Verilog, is used at step 24 to perform a simulation on the circuit defined at steps 18 and 20. In addition, a well-known schematic viewing program or tool is used at steps 14 and 28 to display an electrical circuit schematic diagram of the circuit which has been synthesized at steps 18 and 20. Lastly, a well-known waveform viewing program or tool is used at steps 16 and 30 to display the selected waveforms from the electrical circuit which is displayed at steps 14 and 28, respectively. The circuit synthesis tool used at step 18, the circuit simulation tool used at step 24, the schematic viewing tool used at steps 14 and 28, and the waveform viewing tool used at steps 16 and 30 are all well-known and widely used in the field of semiconductor and electrical circuit design and test. An example of schematic viewing and waveform viewing tools which are suitable for use with the present invention are those known as "Gate Vision" and "Signal Scan," made by EDA Direct. The methodology of the present invention depends upon the use and operation of these conventional tools, as described in more detail below.

Figure 2:
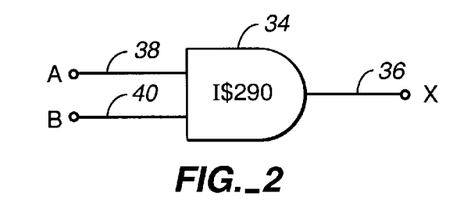
FIG. 2 is a schematic diagram of an exemplary and conventional AND gate, a which has been created, identified and simulated as shown in FIG. 1.

An example of the operation of the conventional circuit synthesis and schematic viewing tools is illustrated very basically in FIG. 2. As shown in FIG. 2, the circuit synthesis tool (used at step 18) has created a conventional AND logic gate 34, which has been designated in the netlist (created at step 20) as "I$290." The schematic viewing tool has displayed the AND logic gate 34. The AND gate 34 has an output terminal designated "X" (as shown in FIG. 2) where its output signal is present at 36. The output signal at 36 results from a logical combination of input signals applied at 38 and 40 respectively to the two input terminals designated as "A" and "B". A combination of two logic high input signals 38 and 40 results in a logic high output signal at 36, and any combination of one logic high and one logic low input signal or two logic low input signals results in a logic low output signal at 36, in accordance with the conventional operation of the AND gate 34. The AND gate 34 is an example of a logic cell to which the present invention pertains.

Figure 3A:
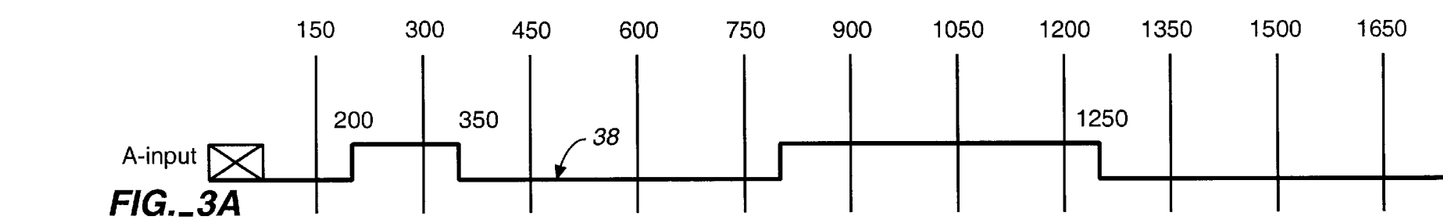
FIGS. 3A, 3B and 3C are waveform diagrams illustrating the operation of the AND gate shown in FIG. 2, which have been simulated as shown in FIG. 1.
Figures 3B, 3C:
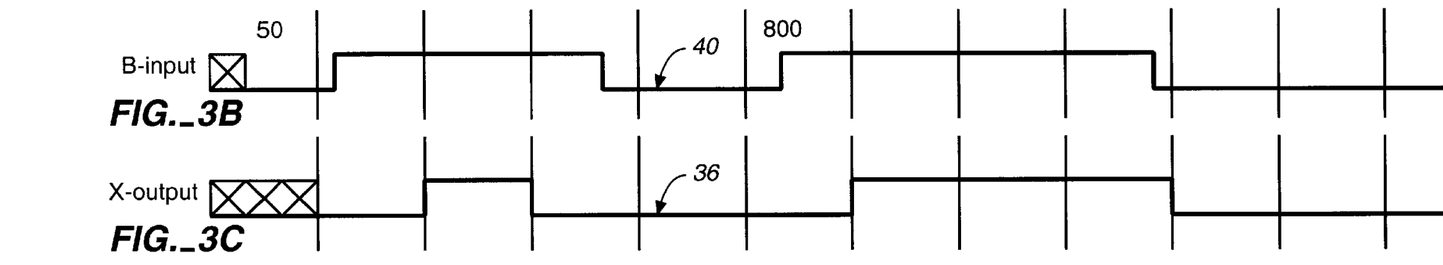

An example of the use and operation of the conventional Verilog simulation tool (step 24, FIG. 1) and the waveform viewing tool (steps 16 and 30 shown in FIG. 1) is illustrated in FIGS. 3A, 3B and 3C, for the AND gate 34 shown in FIG. 2. The waveform viewing tool creates an output waveform 36, FIG. 3C, in response to the states (logic high and logic low) of the input waveforms 38 and 40, FIGS. 3A and 3B, respectively. The simulation tool recognizes the logic function achieved by the AND gate 34, and simulates the output signal 36 based on the input signals 38 and 40. The simulation tool performs its function for each logic cell or component of the circuit and creates a "print on change" file which contains information that describes the output state signal transitions from each logic cell and the time that those output transitions occur. The waveform viewing tool must interact with a "print on change" file of information created for each component or logic cell of the circuit in creating the output signals and the output change state transition times associated with those output signals. The waveform viewing tool interacts with this print on change file to develop and present the output signals.

In addition to defining the logic function and the states of the output signals, the simulation tool also accounts for the delay time associated with the operation of each logic cell. For example, each logic cell has a finite time delay involved from the transition of the input signals until the output signal is presented from the logic cell. The time delays for standard logic cells are determined by semiconductor fabrication processes, and are influenced by other factors such as voltage and temperature. The simulation tool records those delays and allows adding information defining the time delay associated with each logic cell, depending on the process, voltage and temperature.

The simulation tool simulates output signals in response to a selected input stimulus signal, which is selected and applied at step 22 (FIG. 1). The input stimulus signal is selected and established to occur at a predetermined starting time point, which the simulation tool also uses as a reference point with respect to timing all of the output state transitions associated with all of the logic cells. In the case of the simulated waveform diagrams shown in FIGS. 3A, 3B and 3C, for the AND gate 34 (FIG. 2), the relative timing is illustrated as beginning at zero when the two input stimulus signals 38 and 40 are applied to the input terminals A and B of the AND gate 34 (FIG. 2). The waveform viewing tool also keeps track the level of the signals at each time point after the beginning input stimulus is applied.

The input signal 38 at the A input terminal of the AND gate 34 (FIG. 2) is indeterminate for a period of time, for example approximately 75 picoseconds, before the signal 38 achieves a stable logical low-level, as shown in FIG. 3A. The input signal 40 at the B input terminal of the AND gate 34 (FIG. 2) is also indeterminate for short period of time of approximately 50 picoseconds, as shown in FIG. 3B. At approximately 50 picoseconds, the input signal 40 stabilizes at a logic low level. The stabilized low-level input signal 40 will cause the output signal from the AND gate 34 to achieve a low-level, because of the logic functionality of the AND gate 34. The delay time for the AND gate 34 is 100 picoseconds, in this example, causing the output signal 36 to achieve a stable low-level value at 150 picoseconds. The output signal 36 from the AND gate 34 (FIG. 2) is indeterminate from the zero time point until the time point at approximately 150 picoseconds, because of the time delay of the AND gate 34 and the indeterminate status of the input signals 38 and 40 for the first 50 picoseconds. The output signal from the AND gate 34 will not stabilized until after approximately 100 picoseconds have expired after the 50 picoseconds time point when the B input signal first stabilized. At approximately the 150 picosecond time point, the output signal 36 from the AND gate 34 has stabilized at a logic low level, as shown in FIG. 3C. In this example, the predictor of the output signal 36 stabilizing at a logical low-level is the stabilization of the B input signal at the 50 picosecond time point.

At the 170 picosecond time point, the input signal 40 transitions to a logic high level, and thereafter at approximately the 200 picosecond time point, the input signal 38 transitions to a logic high level. At this 200 picosecond time point, both input signals to the AND gate 34 are at a logic high level, which will result in the output signal 36 achieving a logic high level after the 100 picoseconds time delay associated with the AND gate 34. So at 300 picoseconds, the output signal 36 from the AND gate 34 (FIG. 2) goes to a logic high level. The transition of the input signal 38 from a logic low state to a logic high state at the 200 picosecond time point predicts that the output signal 36 will transition to the logic high state. Thus, in this example, the input signal 38 at the A input terminal of the AND gate 34 (FIG. 2) is the input predictor for the output signal transition at the 300 picosecond time point.

At 350 picoseconds, the input signal 38 transitions to a logic low level (FIG. 3A), which will cause and predict that the output signal 36 should go to a logic low level after the 100 picosecond time delay of the AND gate, which thereafter occurs at the 450 picosecond time point. Thus, the transition of the input signal 38 at the 350 picosecond time point is the input predictor for the transition of the output signal 36 from the logic high state to the logic low state at the 450 picosecond time point.

At 520 picoseconds, the input signal 40 transitions from a logic high state to a logic low state. This transition has no effect on the output signal from the AND gate 34, because the other input signal 38 is already at a logic low state.

At 780 picoseconds, the A input signal 38 transitions from a logic low to a logic high state, and thereafter at 800 picoseconds, the B input signal transitions from a logic low state to a logic high state. With both input signals 38 and 40 at logic high states at the 800 picosecond time point, the output signal 36 will transition to a logic high state after the 100 picosecond time delay associated with the AND gate 34. This transition occurs at 900 picoseconds. Because the B input signal 40 caused the transition of the output signal at the 900 picosecond time point, the B signal 40 is the input predictor of the transition which occurs at 900 picoseconds.

At 1250 picoseconds, the A input signal 38 transitions to a logic low state, thereby causing and predicting that the output signal 36 will transition to a logic low state after the expiration of the 100 picosecond time delay associated with the AND gate. The transition of the output signal 36 from the logic high state to the logic low state occurs at the 1350 picosecond time point. The transition of the B input signal 40 from the logic high state to the logic low state at the 1320 time point has no affect on the output signal from the AND gate, because of the previous transition of the A input signal 38 at the 1250 picosecond time point.

The simulation tool (step 24, FIG. 1), which is illustrated by FIGS. 3A, 3B and 3C, develops the transitions of the output digital logic signals based on the logical function of the logic cell in question, the time points of the input signal transitions, the time delay associated with a logic cell in question, and the level of the input signals at the transition times of those input signals. The information is derived for each logic cell of the circuit. The output signal state change and the output signal transition times associated with each state change for each logic cell are stored in a "print on change" file, as it is typically called in Verilog simulations. The creation of this print on change file is shown at step 26 in FIG. 1.

In conventional circuit simulation and analysis, as shown in FIG. 1, the netlist created at step 20 is accessed by the conventional schematic viewing tool to display the circuit diagram, as shown at step 28. In addition and conjunctively, the print on change file, which was created at step 26, is accessed by the conventional schematic viewing tool and the waveforms for selected logic cell are displayed at step 30. The user thereafter selects one of the output waveforms, as shown at step 32, and performs a typical manual analysis previously described at step 33.

Storing the output signal state change transition and timing information for each logic cell in the circuit allows the waveform viewing tool to display the output waveforms from each of the logic cells, in the conventional manner described. However the logic cells which are analyzed must be selected manually by the user, specifically choosing the logic cell in question and then manually working backwards by analyzing each of the input signals and the source of those input signals to determine the cause of any failures or anomalies in the circuit, during a conventional analysis step 33. These disadvantages associated with such a manual analysis are overcome by the methodology of the present invention.

The basic first step 10 of the present method, as shown in FIG. 1, involves creating a predictor file of information simultaneously with the print on change file of information created at step 26. The predictor file of information created at step 10 is derived from the operation of the Verilog simulation tool at step 24 (an example of which has been described in conjunction with FIGS. 3A, 3B and 3C). The predictor file created at step 10 and the print on change file created at step 26 (FIG. 1) contain the information of table 42 shown in FIG. 4. The print on change information contained in table 42 is the information contained in the two most left-hand columns of table 42, and the new predictor information created as a part of the present invention is the information contained in the two most right-hand columns of table 42. The print on change file information and the predictor file information is made available by operating the simulation tool (step 24, FIG. 1). The method of the present invention collects that information represented by table 42, and utilizes that information in a manner to achieve significant improvements and advantages.

The print on change information contained in table 42 (the two left-hand columns, FIG. 4) is derived and exists for each logic cell of the circuit as a result of running the simulation program (step 24, FIG. 1). The information contained in the table 42 identifies the selected logic cell, the output state change or transition of that selected logic cell, and the time of the output signal transition. In the example shown in table 42, the selected logic cell is the AND gate I$290 shown in FIG. 2. As shown in table 42, an output state transition or change to a logic low level is indicated by a "(0)" following the logic cell designation (I$290), and an output state transition or change to a logic high level is indicated by a "(1)" following the logic cell designation (I$290). Both the selected logic cell and its output state or transition are identified in the first column of table 42. The time that the output state or transition occurs is shown in the second column of table 42. The output signal transition time that is shown in the second-from-the-left column is measured and accounted for by the simulation tool relative to the application of the input stimulus signal (step 22, FIG. 1). In other words, the application of the input stimulus signal consti- tutes the beginning time point from which all the signals relevant to all of the logic cells within the circuit are calculated by the simulation tool (step 24, FIG. 1).

In addition to designating the selected logic cell, its output state transition and the time of that transition, predictor file information is also gathered. Preferably the predictor file information is stored in conjunction with the print on change information, or the predictor file information is linked to the print on change information. The new predictor file information collected in accordance with the present invention is shown in the two right-hand columns of the table 42 shown in FIG. 4. Table 42 shows an input predictor in the fourth column which caused the output signal transition in the first column. In the example of the AND gate 34 (FIG. 2) described in conjunction with FIGS. 3A, 3B and 3C, the transition of the output signal to the logic low state ("I$290 (0)") at the 150 picosecond time point occurred as a result of the transition of the B input signal 40 (I$290(B)), as shown in the fourth column of FIG. 4, at the 50 picosecond time point. Thus, the input predictor to the AND gate 34 (I$290) is the B input signal 40 (FIG. 2), which is recorded in the fourth column of table 4 as the input predictor of the output state change which occurred at the 150 picosecond time point. The input predictor, in this example, is designated with respect to the selected logic cell upon which it has its effect (I$290) and with regard to the B input signal to that selected logic cell (I$290(B)).

Figure 4:
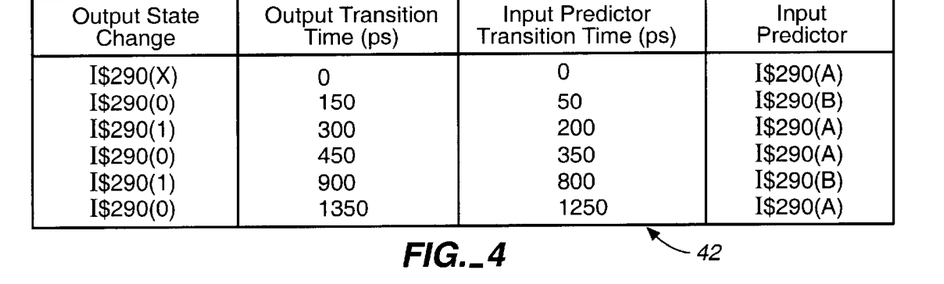
FIG. 4 is a table illustrating the contents of a conventional print on change file and a predictor file, which collectively contain output state change responses, output transition times, input predictor transition times, and input predictor identifications, for the AND gate shown in FIG. 2, created by steps shown in FIG. 1.

The information contained in table 42 also includes, in the third column, the transition time when the input predictor signal occurred. In the case of the input predictor signal (I$290(B)) that signal transitioned into a state which caused it to become the input predictor at the 50 picosecond time point, as has been discussed in conjunction with FIGS. 3B and 3C above. As is discussed more completely below, the identification of the input predictor and the input predictor transition time allows the cone logic to be automatically identified for each preceding level or stage of logic within the circuit.

As a further example of the input predictor and input predictor transition time information contained in the fourth and third columns of table 42, respectively, the transition of the output signal of the AND gate 34 (FIG. 2) from the logic of low state to the logic high state (I$290(1)) which occurred at the 300 picoseconds time point is the result of the A input signal to the AND gate 34 (I$290(A)). The A input signal, which constitutes the input predictor (I$290(A)), transitioned to a logic high level at the 200 microsecond time point (FIG. 3A). Other similar input predictor and input predictor transition time information is recorded for all of the other output signal transitions from the AND gate at all of the output signal transition times at 450, 900 and 1350 picoseconds, as shown in FIG. 4.

The information contained in the third and fourth columns of table 42 is obtained by operating the simulation tool (step 22, FIG. 1). Additional software is written to collect and record the input predictor and input predictor transition time information shown in the third and fourth columns of table 42, and to correlate that information with the selected logic cell, its output state transition and its output transition time recorded in the first and second columns of the table 42. The information defining the input predictor and the input predictor transition time is inherently used by the simulation tool to determine the output state change signal and the output signal transition time of the print on change file, so that input predictor and input predictor transition time information is available to be extracted from the conventional simulation program and recorded in the predictor file at step 10 (FIG. 1) for each cell of the circuit, in the manner as has been described in conjunction with table 42 (FIG. 4).

The information in the predictor file created at step 10 is next used with the information contained in the print on change file created at step 26 to define a logic cone, as shown in FIG. 1 at step 12. To define the logic cone, at step 12, the input predictor information from the predictor file (table 42, FIG. 4) identifies the input signal to the selected logic cell which causes the output transition. This input signal to the selected logic cell was supplied by a different, preceding logic cell located one logic level previous to the selected logic cell. By reference to the circuit defined by the netlist established at step 20, the previous logic cell is identified and automatically included in the logic cone defined at step 12. The input predictor and input predictor transition time for this previous logic cell is then identified by reference to the predictor file for that previous logic cell, and the logic cell in front of it is thereby identified by reference to the netlist and included in the logic cone defined at step 12. Similar iterations are performed for each preceding level of logic cells, to the extent of the number of logic levels selected by the circuit analyst. Once all of the preceding logic cells have been identified, the logic cone is complete at step 12.

The complete logic cone which is defined at step 12 is a series or chain of preceding logic cells which are connected together according to the schematic diagram and which have been selected as a result of their output signals having been the input predictors causing the output transitions of the next subsequent ones of the logic cells in the series or chain. This logic cone is established with reference to a particular output signal transition from the selected logic cell which occurs at a particular output signal transition time, as selected by the analyst. A different cone of logic will exist for output signals at other, different selected output transition times, in most cases.

Figure 5:
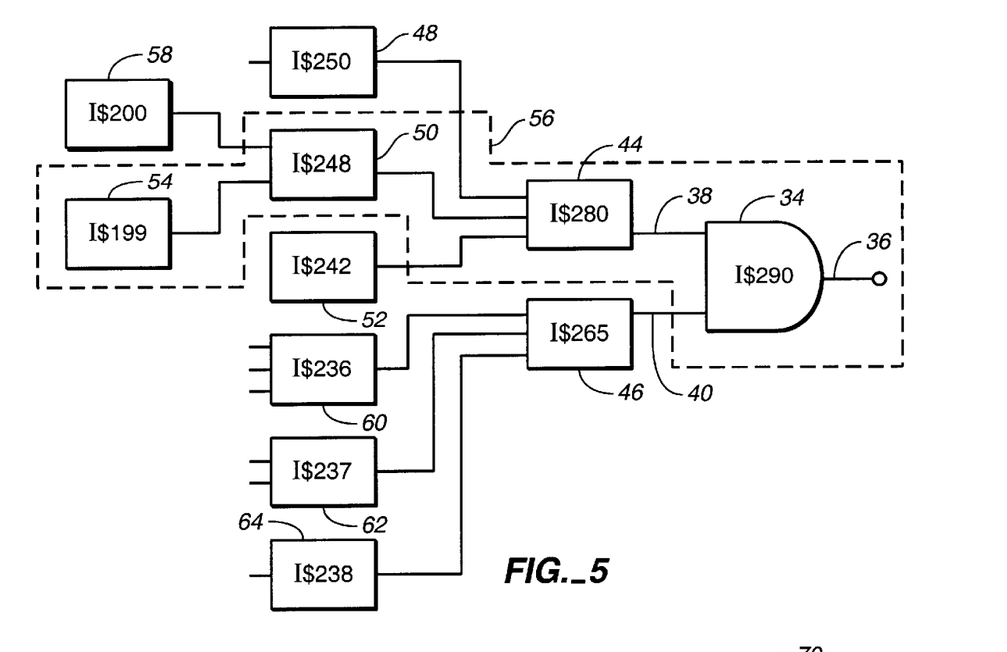
FIG. 5 is a schematic diagram of the AND gate shown in FIG. 2, to which a number of other preceding levels of exemplary logic cells have been connected, illustrating the results of a step of defining a logic cone as shown in FIG. 1.

The step 12 (FIG. 1) of defining the logic cone is illustrated in FIG. 5. At a particular output signal transition time point selected by the analyst, the output signal 36 (FIG. 3C) is selected. Using the output transition time information (second column, table 42, FIG. 4), the input predictor of that output transition is identified (fourth column, table 42, FIG. 4). The transition time of that input predictor is also obtained (third column, table 42, FIG. 4). The input predictor of the AND gate 34 (I$290) is the output signal of a logic cell in a preceding level of logic represented by the logic cells 44 and 46 (I$280 and I$265, respectively). For example, assume that the time point for analysis of the output signal 36 from the AND gate 34 is at 320 picoseconds (FIG. 3C). The input predictor for this output signal transition is the A input signal 38 (I$290(A), FIG. 4). As shown in FIG. 5, the output signal from the logic cell 44 (I$280) is the A input signal 38. The simulation tool uses the 200 picosecond time point for the A input signal 38 (FIG. 3A) and the time delay associated with the logic cell 44, to determine which of the input signals to logic cell 44 (from logic cell 48, 50 or 52 (I$250, I$248, I$242, respectively)) is the input predictor of the output signal 38 from logic cell 44. Assume the predictor for logic cell 44 is the output signal from logic cell 50 (I$248). The file of input predictors and predictor transition times for the logic cell 50 (I$248) is thereafter accessed and used, along with the time delay of the logic cell 50, to identify the input predictor to the logic cell 50 and its transition time. In the example shown in FIG. 5, assume that the input predictor to logic cell 50 is the logic cell 54 (I$199). In the example shown in FIG. 5, the logic cone is thereby identified at 56, and the logic cone includes the logic cells 34, 44, 50 and 54. The logic cone 56 is four levels or stages of logic deep, with each stage or level being represented by different one of the cells 34, 44, 50 and 54.

In the derivation and definition of the logic cone 56 shown in FIG. 5, those logic cells which do not supply output predictors at the point in time of interest of the output signal are not automatically included in the logic cone. For example, logic cell 58 does not supply the input predictor signal to the logic cell 50, because logic cell 54 supplies the input predictor. Therefore logic cell 58 is not within the logic cone 60. Similarly, logic cell 46 does not supply the input predictor to the AND gate 54, so the logic cell 46 and the logic cells 60, 62 and 64 which supply input signals to the logic cell 46 are not included within the logic cone 56.

Thus, in the manner described and illustrated by the example in FIG. 5, the output signal transition from a selected logic cell is recognized as having been caused by an input predictor which transitioned at a known input predictor transition time. The identified input predictor to a logic cell and the transition time of that input predictor identifies the preceding logic cell in the preceding logic level which caused that input predictor, because the input predictor to the subsequent logic cell is the output signal from the preceding logic cell. With this information, the print on change and predictor files (table 42, FIG. 4) for the preceding logic cell is thereafter examined, and its input predictor and input predictor transition times are identified. Using the transition times and the delay times of each preceding logic cell allows the logic cone to be automatically identified and defined.

After the logic cone is defined at step 12, the schematic diagram of the logic cone is displayed at step 14, as shown in FIG. 1. Automatically displaying the logic cone at step 14 has the benefit of facilitating the analysis, because the analyst sees the entire critical path of logic cells which define the logic cone, without requiring the manual selection of relevant logic cells. Moreover, only the relevant portion of the overall schematic diagram is displayed as the logic cone at step 14, which also facilitates a more focused and rapid analysis of only the relevant circuitry.

Defining the logic cone automatically in this manner based on the input predictors is a considerable improvement because the task of identifying the preceding logic cells which predict the transition is done automatically, rather than manually. Previously, identifying the preceding logic cells manually required considerable mental effort and time to compare the various signals and thereby identify the one which actually caused the output transition. Because of the effort and time involved, the tedium of such manual identification frequently resulted in errors and greatly enhanced the risk of errors. Moreover, the effort involved greatly extended the time required for such analysis.

To further facilitate the analysis, the simulated waveforms for the relevant cells of the logic cone are also displayed at step 16, as shown in FIG. 1, preferably in conjunction with the display of the schematic diagram of the logic cone at step 14. Displaying only the relevant waveforms relative to be relevant logic cells of the logic cone facilitates a more focused and rapid analysis of the relevant circuitry.

Figure 6:
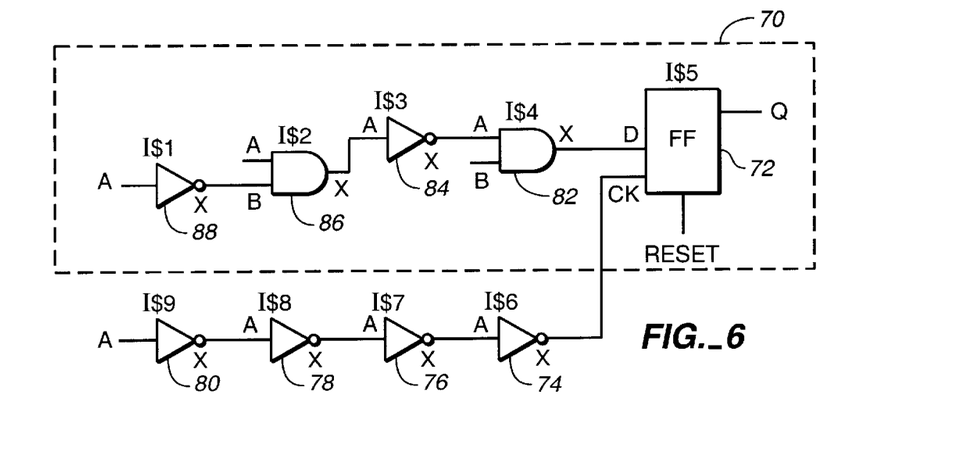
FIG. 6 is a schematic diagram of other exemplary logic circuitry, also illustrating the results of a step of defining a logic cone as shown in FIG. 1.
Figure 7A:
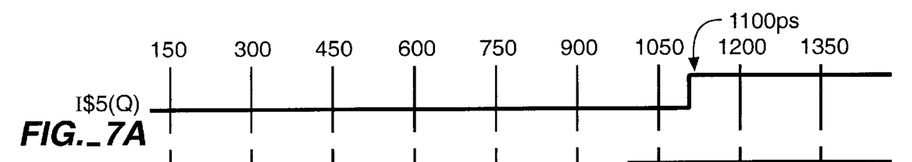
FIGS. 7A, 7B, 7C, 7D, 7E, 7F, 7G, 7H, 7I, 7J, 7K, 7M and 7N are waveform diagrams of the logic cone of the exemplary logic circuitry shown in FIG. 6, shown on a common time axis, and generated and displayed by a conventional waveform simulation tool according to the method shown in FIG. 1.
Figure 7B:
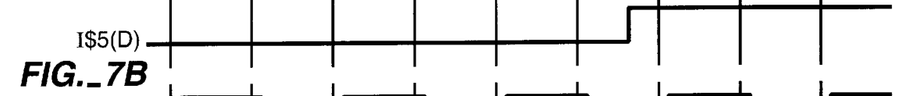
Figure 7C:
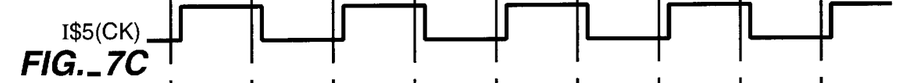
Figure 7D:
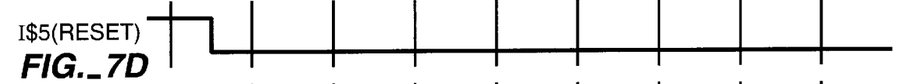
Figure 7E:
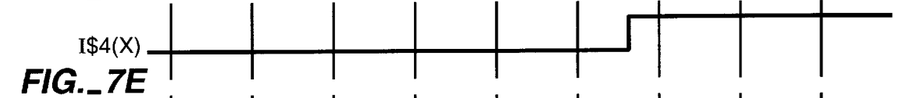
Figure 7F:
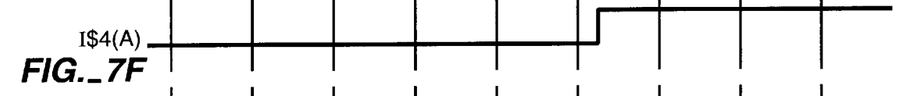
Figure 7G:
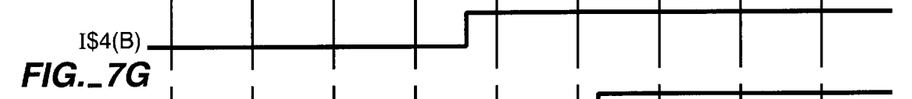
Figure 7H:
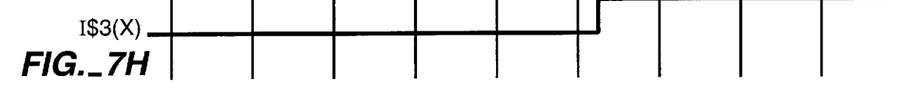
Figure 7I:
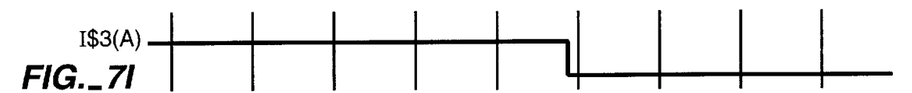
Figure 7J:
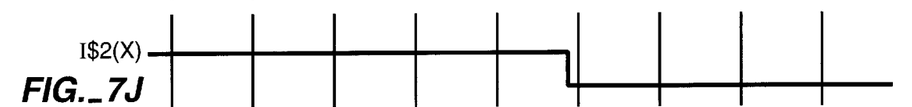
Figure 7K:
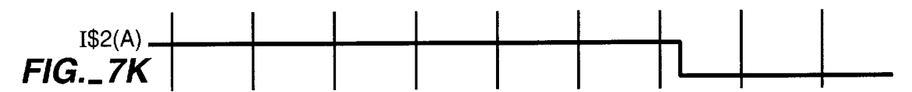
Figure 7L:
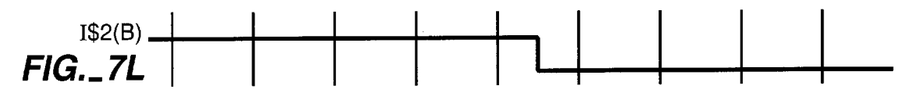
Figure 7M:
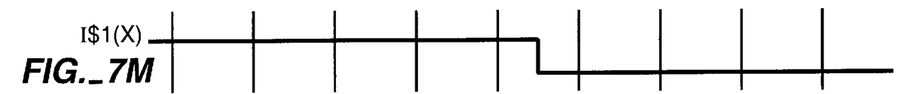
Figure 7N:
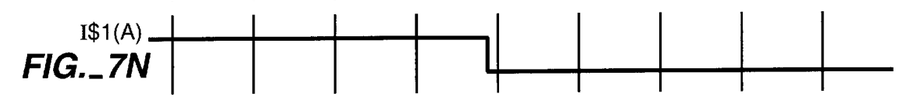

The steps 14 and 16 (FIG. 1) of displaying the logic cone and simulated waveforms for the relevant logic cells of the logic cone is illustrated in more detail in FIG. 6 and in FIGS. 7A to 7N, respectively, using the schematic circuit diagram shown in FIG. 6 as another example. As shown in FIG. 6, a logic cone 70 at a particular time has been defined and displayed for examining the output signal Q of a flip-flop 72 (I$5). For illustrative purposes in FIG. 6, a clock signal (CK)

from a string of series-connected inverters 74, 76, 78 and 80 (I$6, I$7, I$8, I$9, respectively) is also shown, but would normally not be displayed in conjunction with step 14 (FIG. 1) of displaying the logic cone. In addition to the flip-flop 72, the logic cone 70 includes an AND gate 82 (I$4), an inverter 84 (I$3), another AND gate 86 (I$2) and a buffer amplifier 88 (I$1).

The relevant logic cone 70 exists only as of a particular time at which the output signal Q from the flip-flop 72 is examined, and that time point is 1100 picoseconds as shown in FIG. 7A. The operation of the simulation tool (step 24, FIG. 1) recognizes the functionality of the flip-flop 72, and that the flip-flop 72 has a predetermined time delay before its output signal Q changes states. The Q output signal changes based on the D input signal, the clock signal (CK) and the reset signal (RESET), which are respectively shown in FIGS. 7B, 7C and 7D. Because the reset signal (FIG. 7D) is not relevant during normal operation of the circuit, after having first established the output signal of the flip-flop 72 in a predetermined initial state, the reset signal (FIG. 7D) is not the input predictor. Furthermore, the clock signal (FIG. 7C) is also not the input predictor at the 1100 picosecond time point, because the clock signal simply clocks the D input signal to cause a transition of the output signal Q from the flip-flop 72. Thus, the D input signal (FIG. 7B, I$5(D)) is the input predictor for the flip-flop 72. The clock signal (FIG. 7C) and the reset signal (FIG. 7D) may or may not be shown for understanding purposes in conjunction with the step 16 (FIG. 1).

The D input signal to the flip-flop 72 is the output signal (I$4(X), FIG. 7E) of the AND gate 82. The output signal of the AND gate 82 is predicted by the A input signal to the AND gate 82 as shown in FIG. 7E. The transition of the output signal (I$4(X), FIG. 7E) from the AND gate 82 occurs after a predetermined time delay from the transition of the A input signal (I$4(A), FIG. 7F) to the AND gate 82. The B input signal (I$4(B)) to the AND gate 82 is also shown in FIG. 7G, although it is not an input predictor and may or may not be shown for understanding purposes in conjunction with step 16 (FIG. 1).

The A input signal (I$4(A)) to the AND gate 82 is the output signal (I$3(X), FIG. 7H) of the inverter 84. The output signal (FIG. 7E) from the AND gate 82 occurs only after the predetermined time delay associated with the AND gate 82 after the transition of the A input signal (FIG. 7F) to the AND gate 82. The input predictor (I$3(A), FIG. 7I) to the inverter 84 is the output signal I$2(X), FIG. 7J) from the AND gate 86. The transition of the output signal of the inverter 84 occurs after the predetermined time delay associated with the inverter 84, as shown by the time difference between the transitions of the signals shown in FIGS. 7H and 7I.

The input signal to the inverter 84 (I$3(A), FIG. 7I) is the output signal from the AND gate 86 (I$2(X), FIG. 7J). The B input signal (I$2(B), FIG. 7L) to the AND gate 86 is the input predictor of the output signal from the AND gate 86 (FIG. 7J). The A input signal (I$2(A), FIG. 7K) may be displayed for understanding purposes in the step 16 (FIG. 1), although this signal is not an output predictor.

The output signal from the buffer amplifier 88 (I$1(X), FIG. 7M) is predicted by the single input signal to the buffer amplifier 88 (I$1(A), FIG. 7N). The output signal from the buffer amplifier 88 (FIG. 7M) occurs a predetermined time delay after the transition of the input signal (FIG. 7N).

The waveform viewing tool is used to display the relevant waveforms for the relevant cells of the logic cone 70, as shown by FIGS. 7A to 7M, to accomplish the step 16 (FIG. 1). The analyst may optionally choose to display other waveforms at each stage or level of the logic cone 70 for purposes of completing an understanding of the input predictor signals at each logic cell of the logic cone.

The depth or number of logic levels or stages for which the relevant waveforms (FIGS. 7A to 7N) is five as shown in FIG. 6. In other words, the number of logic levels or the depth of logic levels is that number of logic cells in the circuit schematic diagram which precedes the output signal in question. The depth or level of logic cells include the logic cell which supplies the output signal under analysis and the preceding number of logic cells which contribute to that output signal.

With the information displayed at steps 14 and 16, the analyst may perform the analysis at step 33 (FIG. 1), by focusing only on the relevant logic cells defined by the logic cone, and the waveforms of those relevant logic cells of the logic cone, not the entire circuitry and waveforms from the entire circuit or semiconductor integrated circuit. An understanding of those relevant logic cells is thereby greatly facilitated by displaying only the relevant logic cells of logic cone and their associated waveforms, selected in response to a selected output signal from a selected logic cell existing at any predetermined time. To perform the analysis at step 33, the information displayed at steps 14 and 16 is available for the analyst to refer to and study. To perform the analysis at step 33 to identify problems arising from the actual implementation of the circuitry in a semiconductor chip, actual signals from the relevant nodes of the specific logic cell implemented in the IC are obtained, and those signals are compared to the simulated waveforms obtained at step 16. A discrepancy between the simulated waveforms and the actual signals indicates a fault or anomaly which could thereafter be easily traced by using the logic cone displayed at step 14. The display of the relevant logic cells of the logic cone also facilitates locating the logic cells actually implemented in the IC.

By displaying only the relevant logic cone, the analyst need not separately analyze each logic level in a rearwardly sequential step-by-step manner. Instead, the analyst may jump to the beginning of the logic cone and immediately compare the signals at those locations to those which are predicted. If a discrepancy is noted at the beginning of the logic cone, all the time which would have otherwise have been spent in manually tracing logic cells and waveforms of the logic cone will have been saved. Of course, the decision as to the location for starting the analysis is subjective to the analyst, but may be based on suspicion or intuition of the analyst. The analyst's insight into the circuit behavior is greatly facilitated by viewing the logic cone which is automatically derived by the present invention and the simulated waveforms which are also automatically associated with that logic cone.

Figure 8:
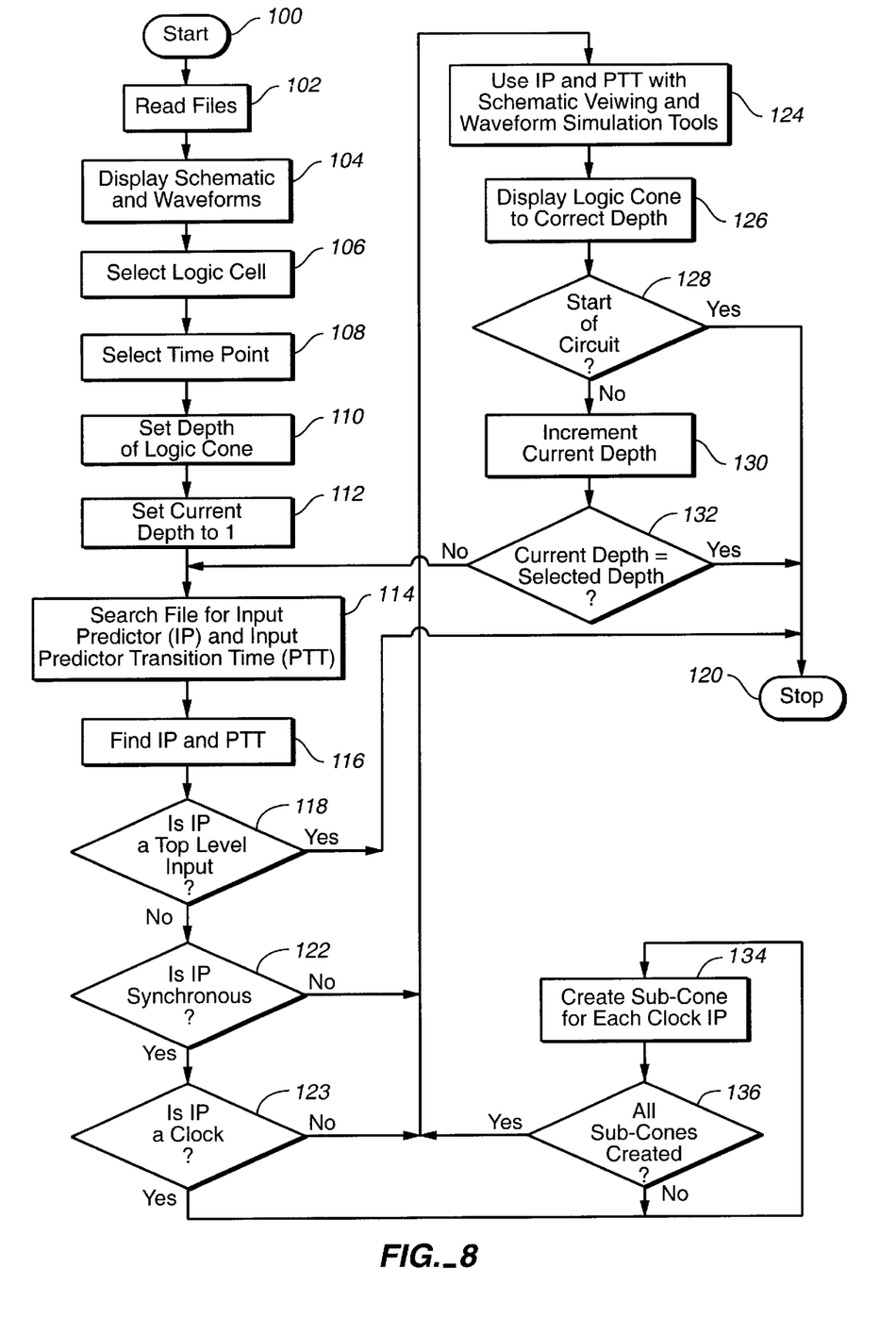
FIG. 8 is a more detailed flowchart of certain steps of practicing the method more generally shown in FIG. 1.

With the foundational description presented above, a more complete understanding of the detailed steps of the methodology of the present invention is described in conjunction with FIG. 8. The methodology of the present invention starts at step 100 and progresses to reading the print on change and predictor files which contain the identification of the logic cell, the output state change, the output transition time, the input predictor transition time and the input predictor (e.g., table 42, FIG. 4), as shown at step 102. In the flowcharts shown in FIGS. 8 and 9, the input predictor is abbreviated as "IP" and the input predictor transition time is abbreviated as "PTT." After reading the files at step 102, the circuit schematic and waveforms are displayed at step 104 in the conventional manner as has been previously described in connection with steps 28 and 30 (FIG. 1), using the simulation tool.

Once the schematic and the waveforms have been displayed at step 104, the analyst selects the logic cell at which the analysis is to commence, as shown at step 106 (also shown at step 32, FIG. 1). The time point at which the logic cone is to be defined is selected at step 108, preferably by clicking with a mouse on the transition edge of the displayed output waveform from the selected logic cell at the selected output transition time. Selecting this time point at step 108 of the output waveform becomes the reference time point for establishing the selected logic cone since the input predictors (IPs) and the input predictor transition times (PTTs) are all established with respect to this reference output transition time point.

Next, at step 110, the analyst selects the depth of the logic cone to be analyzed. As discussed previously in conjunction with FIGS. 5 and 6, the depth of the logic cone is the number of previous logic cells which influence the output signal from the selected logic cell and which are to be considered in defining the logic cone. After the depth of logic cone is set at step 110, the current depth for the analysis is set to one at step 112, as the starting point for the development of the logic cone from the selected logic cell.

At step 114, the predictor file of the input predictors (IP) and the input predictor transition times (PTTs) is searched. Thereafter at step 116, the input predictor (IP) and the input predictor transition time (PTT) are found as a result of searching the file at step 114. At step 118, a determination is made as to whether the input predictor is a top-level input to the logic cone. A top-level input would be the input stimulus to the circuit, which resulted in the output signal of interest from the selected logic cell. A top-level input would not be generated by the relevant logic cells of the logic cone. Thus, an affirmative determination at step 118 would result in the termination of the methodology of the present invention as shown at step 120. However, if the determination at step 118 is negative, indicating that the input predictor is part of the logic cone under consideration, the program flow progresses to step 122.

At step 122, a determination is made as to whether the input predictor is a synchronous signal. An input predictor which is a synchronous signal in a logic circuit will usually be a clock signal applied to a synchronous logic element, such as the flip-flop 72 described in FIG. 6. However, a synchronous signal could arise from other, somewhat unusual sources. In most cases, a reset signal will not be a synchronous signal, because the reset signal is usually the primary input predictor for the initial state of the entire circuit. As such, it is generally not necessary to trace and examine a logic cone associated with a reset signal.

In circumstances where the input predictor is a synchronous signal, it will be necessary to examine the path of the synchronous signal as a part of the logic cone. For example, both the data signal and a clock signal to a D-type flip-flop influence the Q output signal from that flip-flop. Under those circumstances it may be necessary or desirable to trace both of the logic cones associated with the data signal and the clock signal.

If the input predictor is a signal from a non-synchronous logic cell, such as a gate, the determination at step 122 is negative. Even if the input predictor is from a synchronous logic cell as determined by an affirmative determination at step 122, a further determination is made at step 123 as to whether the input predictor is a clock signal. If the determination at step 123 is negative, the input predictor is a data signal. In most cases when a synchronous logic cell is encountered in the logic cone, the primary signal of input prediction significance will be the data signal. Under such circumstances as identified by the determination at step 123, the data signal will be handled in a manner similar to a negative determination at step 122, indicating that the input predictor is from a non-synchronous logic cell. Thus, negative determinations at steps 122 and 123 will advance the program flow to step 124.

At step 124, the input predictor (IP) and the input predictor transition time (PTT) which were found at step 116 are used with the schematic viewing tool and the waveform viewing tool to cause those tools to display the logic cone to the current depth as shown at step 126. In other words, at steps 124 and 126, the schematic viewing tool and the waveform viewing tool have begun to develop the logic cone. The logic cone is developed only to the extent of the current depth, with the current depth initially being set at step 112 and subsequently being incremented at step 130, as described below. Iterations of the process will occur, as is discussed below, until the entire logic cone is developed and displayed to the extent of the desired depth selected at step 110.

If the displayed current depth of the logic cone results in displaying the start or beginning point of the circuit, as determined at step 128, no further logic cell circuit elements are included in the logic cone and the program flow terminates at step 120. However, if the determination at step 128 is negative, indicating that there is further depth to the logic cone, the current depth of the logic cone is incremented at step 130. Thereafter at step 132, a determination is made at step 132 as to whether the current depth is equal to the depth selected at step 110. If the determination at step 132 is affirmative, the depth of the logic cone displayed at step 126 is equal to that selected by the analyst at step 110, and therefore the program flow should terminate at step 120. However, if the determination at step 132 is negative, indicating that further depths of the logic cone must be developed and presented, the program flow returns to step 114.

The return of the program flow to step 114 from step 132 causes the. program flow to iterate again through steps 11 4,116, 118, 122, 123, 124, 126, 128, 130, 132 and 120 in the same manner as has been previously described, until an input stimulus is identified as the input predictor as determined at step 118, or until the beginning or starting point of the logic cone is reached as determined at step 128, or until the selected depth of the logic cone is reached as determined at step 132.

In those cases of an input predictor arising from a synchronous logic cell as determined at step 122 and when that input predictor is a clock signal as determined at step 123, logic sub-cones must be created within the primary logic cone to examine the synchronous waveforms, as a part of the primary logic cone. The logic sub-cone maybe thought of as branches from the primary logic cone, and will be displayed in conjunction with the primary logic cone and its simulated waveforms. Step 134 generally describes the creation of each sub-cone for each clock input predictor. Step 134 will be described below in connection with FIG. 9. It may also be possible that multiple sub-cones exist for each primary logic cone. This circumstance would occur when multiple synchronous elements are encountered in the primary logic cone.

An example of a logic sub-cone is illustrated in FIG. 6. The synchronous clock signal (CK) is generated from the series connected inverters 74, 76, 78 and 80. These inverters and the signals from them constitute a sub-cone if the clock signal is the input predictor to be output signal from the flip-flop 72.

Referring back to FIG. 8, at step 136, a determination is made of whether all of the logic sub-cones and their simulated waveforms have been created within the primary logic cone for the selected depth of the primary logic cone as set at step 112 and determined at step 132. If not, the program flow reverts back to step 134, until all of the sub-cones for that particular depth of the primary logic cone have been created. Once all of the sub-cones for the particular depth of logic within the primary logic cone have been created, as determined at step 136 by an affirmative determination, the program flow reverts to back to step 124 where the input predictors and the input predictor transition times associated with each sub-cone are used by the schematic viewing and waveform viewing tools at step 124 so that the sub-cones are displayed at step 126 in the manner previously described. In this manner, the sub-cone generated by the clock input predictors will be added to the primary logic cone for consideration in the same manner as the non-synchronous input predictors will be added and displayed.

Figure 9:
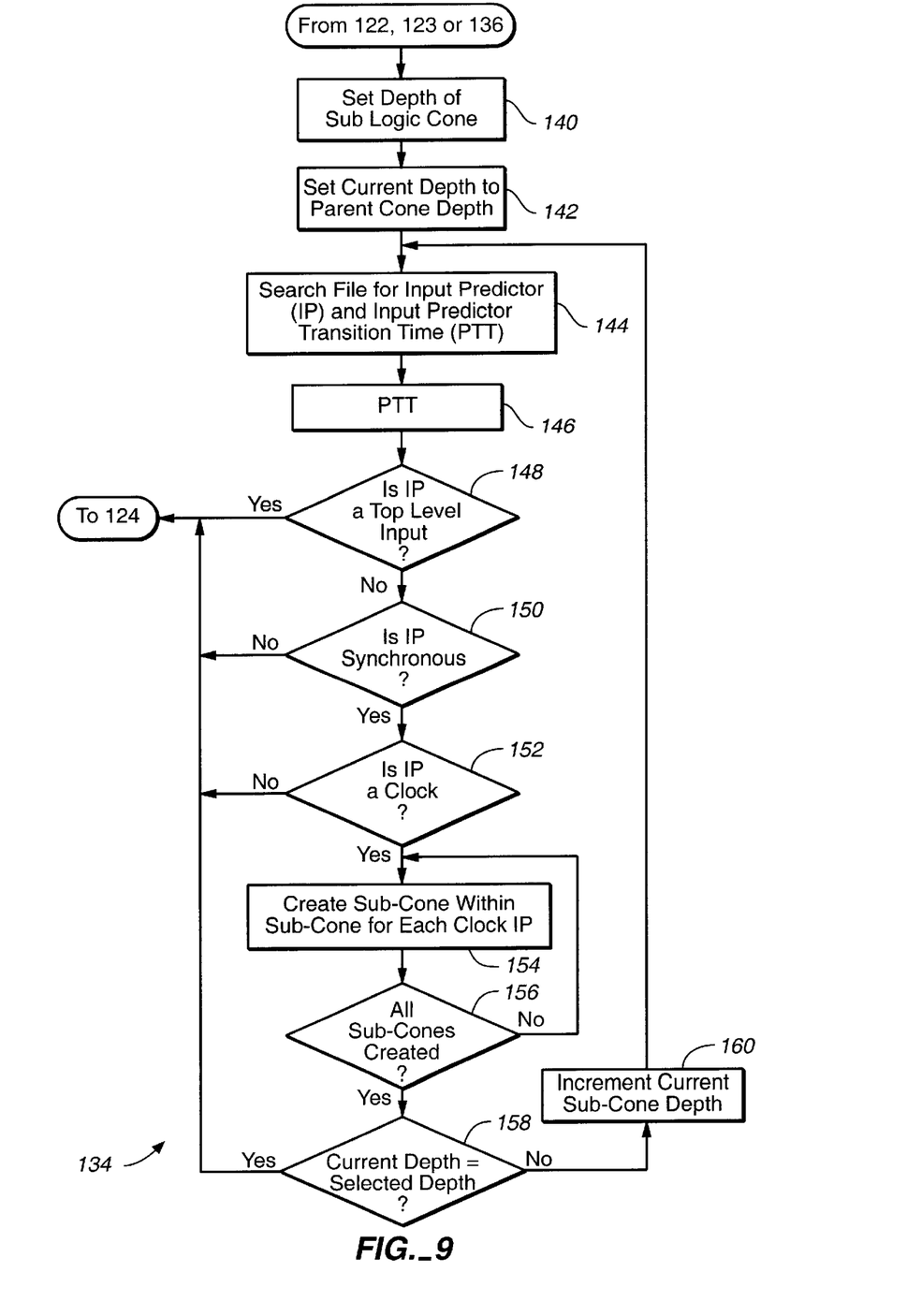
FIG. 9 is a more detailed flowchart of one of the steps of the method shown more generally in FIG. 8.

The step 134 of creating sub-cones for each clock input predictor is shown in more detail in FIG. 9. Many of the steps of the flowchart shown in FIG. 9 are similar to those previously described in FIG. 8, but are repeated as necessary to create each logic sub-cone as determined at step 134 (FIG. 8). The first step 140 shown in FIG. 9 is entered from either steps 122, 123 or 136 (FIG. 8). At step 140, the depth of the logic sub-cone to be analyzed is set. The depth of the logic sub-cone may be greater than or less than the depth of the parent logic cone under analysis, at the discretion of the analyst. At step 142, the current depth of the logic sub-cone is set to the current depth of the parent logic cone. Setting the current depth of the logic sub-cone at step 142 to the current depth of the parent logic cone assures that the logic sub-cone will commence at a coordinated, location to the parent cone. At step 144, the file of the output state changes, the output transition times, the input predictor transition times (PTTs) and the input predictors (IP) for the logic cell in question are accessed, and the applicable input predictor (IP) and the applicable input predictor transition time (PTT) is found at step 146.

Next, at step 148 a determination is made as to whether the input predictor (IP) found at step 146 is a top level input to the circuit. If so, a program flow shown in FIG. 9 reverts back to step 124 (FIG. 8). If the determination at step 148 is negative, a further determination is made at step 150 as to whether the input predictor (IP) came from a synchronous logic cell. If not, the program flow reverts to step 124 (FIG. 8). If the determination at step 150 is affirmative, a further determination is made at step 152 as to whether the input predictor (IP) is a clock signal. If not, the program flow returns to step 124. If the determination at step 152 is affirmative, a further synchronous logic cell within the sub-logic cell has been identified. Therefore, it will be necessary to create a sub-cone within the sub-cone for each clock input predictor as shown at step 154.

The step 154 is essentially accomplished by an iteration of all of the steps shown in FIG. 8, for the sub-cone within the sub-cone. Because of the similarity to the steps described in FIG. 8, it is unnecessary to further describe the step 154 with respect to each sub-cone within a sub-cone. At step 156, after one sub-cone within the sub-cone has been created, the program flow progresses from step 156 to step 154 until all of the sub-cones within the sub-cone have been created.

Once an affirmative determination occurs at step 156, the current depth of the sub-cone is checked at step 158 to determine whether it is equal to the depth selected at step 140. Until the current sub-cone depth is equal to the selected depth as established by negative determination at step 158, the program flow moves to step 160 where the current depth of the sub-cone is incremented. Thereafter the program flow reverts back to step 144, where the series of steps previously described is again incremented until the sub-cone depth reaches the selected depth as determined affirmatively at step 158. Thereafter, the program flow reverts to step 124 (FIG. 8).

Step 146 shown in FIG. 9 results in finding the input predictor (IP) and the input predictor transition time (PTT) for each logic cell in each sub-cone, and each logic cell of each sub-cone within a sub-cone. Thus, when the transition to step 124 (FIG. 8) occurs from FIG. 9, the input predictors and input predictor transition times are available to be used by the schematic viewing and waveform viewing tools as shown at step 124 in FIG. 8. Thereafter at step 126 shown in FIG. 8, all of the sub-cones and the sub-cones within sub-cones will be displayed, for that given level of logic of the primary cone. It is in this manner that the steps 12, 14 and 16 are accomplished in the basic program illustrated in FIG. 1.

As is apparent from the detailed description of the methodology of the present invention, the analysis of complex logic circuits is greatly facilitated. The present invention utilizes conventional simulation, schematic viewing and waveform viewing tools to provide information and convenience to the circuit analyst which is not believed to have previously been available. Specifically, the present invention allows the analyst to choose a logic cell and a point in time of an output signal from that selected logic cell and analyze only the relevant portions of the more complex circuit which predict that output signal at the selected time. The analysis is facilitated by displaying only the relevant portion of the circuit in the form of the logic cells defining the logic cone, and any relevant logic sub-cones within the primary logic cone, as well as the waveform simulations associated with the logic cells of the relevant logic cone. The analyst can quickly evaluate this information to establish an understanding of the functionality of the circuit or to identify the cause of a defect within the circuit. By not having to manually trace through an entire complex circuit, and to make mental determinations based on simulations at each manually traced point, a large amount of time is saved and the analyst is spared from the tedium and risk of error in a having to manually determine each point and each waveform for analysis at a relatively large number of nodes within a complex circuit. These benefits and improvements are obtained as a result of identifying, collecting and utilizing information from, and applying that collected information to, the conventional simulation, schematic viewing and waveform viewing tools in the manner described. In many other significant improvements and advantages will be apparent once a complete understanding of the present invention has been gained.

A preferred embodiment of the present invention and many of its improvements have been described with a degree of particularity. This description is of a preferred example of implementing the invention, and is not necessarily intended to limit the scope of the invention. The scope of the invention is defined by the following claims.

The invention claimed is:

1. A method of identifying and displaying relevant ones of a plurality of connected logic cells and waveforms from the relevant logic cells of a circuit described by using a simulation tool, the waveforms including input and output waveforms to and from each relevant logic cell, the simulation tool describing a transition and a transition time point when the transition occurs, said method comprising the steps of:

selecting an output waveform and a transition time point of the selected output waveform delivered from a selected logic cell;

identifying a predictive input waveform and a transition time of the predictive input waveform to the selected logic cell which causes the transition of the output signal from the selected logic cell at the selected transition time;

identifying a predictive logic cell connected to the selected logic cell which supplies the output waveform to the selected logic cell which constitutes the predictive input waveform identified in the preceding step;

performing at least one new repetition of the aforesaid three steps to accomplish the selecting and identifying steps under circumstances where the predictive logic cell identified in a previous repetition becomes the selected logic cell for the new repetition and the transition time point of the predictive input waveform to the selected logic cell of the previous repetition becomes the selected transition time of the output waveform of the selected logic cell for the new repetition;

obtaining signals from a functional embodiment of the circuit at locations in the functional embodiment of the circuit which correspond to locations of the displayed waveforms; and comparing the displayed waveform to the signals obtained from the corresponding locations in the functional embodiment of the circuit.

2. A method as defined in claim 1, further comprising the steps of:

displaying a schematic diagram of the selected and predictive logic cells identified from all of the repetitions; and displaying the input and output waveforms of the selected and predictive logic cells identified from the all of the repetitions.

3. A method as defined in claim 2, further comprising the steps of:

displaying a schematic diagram of the identified selected and predictive logic cells by using a conventional schematic viewing tool; and displaying the identified input and output waveforms by using a conventional waveform viewing tool.

4. A method as defined in claim 1, further comprising the step of:

selecting the number of repetitions.

5. A method as defined in claim 1, further comprising the step of:

performing repetitions until the predictor input waveform is identified as a stimulus input waveform applied to the waveform viewing tool.

6. A method as defined in claim 1, further comprising the step of:

performing repetitions until the identified predictive logic cell is a beginning logic cell of the circuit.

7. A method of identifying and displaying relevant ones of a plurality of connected logic cells and waveforms from the relevant logic cells of a circuit described by using a simulation tool, the waveforms including input and output waveforms to and from each relevant logic cell, the simulation tool describing a transition and a transition time point when the transition occurs, said method comprising the steps of:

creating netlist information describing the logic cells of the circuit by using the simulation tool;

creating information describing output waveforms from the logic cells described by the netlist by using the simulation tool and by information describing each transition and each transition time for the input and output waveforms to and from each logic cell;

selecting an output waveform and a transition time point of the selected output waveform delivered from a selected logic cell;

identifying a predictive input waveform and a transition time of the predictive input waveform to the selected logic cell which causes the transition of the output signal from the selected logic cell at the selected transition time;

identifying a predictive logic cell connected to the selected logic cell which supplies the output waveform to the selected logic cell which constitutes the predictive input waveform identified in the immediately preceding step; and performing at least one new repetition of the aforesaid immediately preceding three steps to accomplish the selecting and identifying steps under circumstances where the predictive logic cell identified in a previous repetition becomes the selected logic cell for the new repetition and the transition time point of the predictive input waveform to the selected logic cell of the previous repetition becomes the selected transition time of the output waveform of the selected logic cell for the new repetition.

8. A method as defined in claim 7, further comprising the steps of:

creating information describing the state of the output waveform at each transition of the output waveform and describing the time point of the output waveform transition for each logic cell by using the simulation tool;

attributing time delay information to each logic cell of the circuit, the time delay information describing a time delay between the occurrence of the predictive input waveform and the transition of the output waveform for each logic cell; and deriving the predictive input waveform and the transition time point of the predictive input waveform by using the information describing the state of the output waveform at each output waveform transition and the time point of the output waveform transition for each logic cell, the time delay information associated with each selected and predictive logic cell, and the information describing the connections between the logic cells.

9. A method as defined in claim 8, further comprising the step of:

creating at least one file of the information for each logic cell of the circuit, the information of each file including information which describes the state of the output waveform at each output waveform transition, the time of each output waveform transition, the predictive input waveform, and the transition time of the predictive input waveform which results in the output waveform transition.

10. A method as defined in claim 9, further comprising the step of:
    referring to the file of information for each predictive logic cell to perform each repetition.

11. A method as defined in claim 10, further comprising the step of:
    creating the file of information when using the simulation tool to describe the logic cells of the circuit and to describe the input and output signals of the logic cells; and
    performing each repetition after the file of information has been created.

12. A method as defined in claim 7, further comprising the step of:
    selecting the number of repetitions.

13. A method as defined in claim 7, further comprising the step of:
    performing repetitions until the predictor input waveform is identified as a stimulus input waveform applied to the waveform viewing tool.

14. A method as defined in claim 7, further comprising the step of:
    performing repetitions until the identified predictive logic cell is a beginning logic cell of the circuit.

15. A method as defined in claim 7, further comprising the steps of:
    displaying a schematic diagram of the selected and predictive logic cells identified from all of the repetitions; and
    displaying the input and output waveforms of the selected and predictive logic cells identified from the all of the repetitions.

16. A method as defined in claim 15, further comprising the steps of:
    displaying a schematic diagram of the identified selected and predictive logic cells by using a conventional schematic viewing tool; and
    displaying the identified input and output waveforms by using a conventional waveform viewing tool.

17. A method of identifying and displaying relevant ones of a plurality of connected logic cells and waveforms from the relevant logic cells of a circuit described by using a simulation tool, the waveforms including input and output waveforms to and from each relevant logic cell, the simulation tool describing a transition and a transition time point when the transition occurs, said method comprising the steps of:
    selecting an output waveform and a transition time point of the selected output waveform delivered from a selected logic cell;
    identifying a predictive input waveform and a transition time of the predictive input waveform to the selected logic cell which causes the transition of the output signal from the selected logic cell at the selected transition time;
    identifying a predictive logic cell connected to the selected logic cell which supplies the output waveform to the selected logic cell which constitutes the predictive input waveform identified in the preceding step;
    performing at least one new repetition of the aforesaid three steps to accomplish the selecting and identifying steps under circumstances where the predictive logic cell identified in a previous repetition becomes the selected logic cell for the new repetition and the transition time point of the predictive input waveform to the selected logic cell of the previous repetition becomes the selected transition time of the output waveform of the selected logic cell for the new repetition; and
    performing the at least one new repetition until the predictive input waveform is identified as a synchronous waveform.

18. A method as defined in claim 17, further comprising the step of:
    identifying the predictive input waveform as a clock waveform.

19. A method as defined in claim 17, further comprising the steps of:
    defining a cone of connected predictive and selected logic cells by performing the repetitions; and
    including within a sub-part of the cone, at least one predictive and selected synchronous logic cell.

20. A method as defined in claim 19, further comprising the step of:
    performing the repetitions to define the sub-part of the cone.

21. A method as defined in claim 20, further comprising the step of:
    selecting the number of repetitions to define the sub-part of the cone.

22. A method as defined in claim 20, further comprising the step of:
    performing repetitions until the predictor input waveform is identified as a stimulus input waveform applied to a logic cell of the defined sub-part of the cone.

23. A method as defined in claim 20, further comprising the step of:
    performing repetitions until the identified predictive logic cell is a beginning cell of the sub-part of the cone.

24. A method as defined in claim 17, further comprising the step of:
    selecting the number of repetitions.

25. A method as defined in claim 17, further comprising the step of:
    performing repetitions until the predictor input waveform is identified as a stimulus input waveform applied to the waveform viewing tool.

26. A method as defined in claim 17, further comprising the step of:
    performing repetitions until the identified predictive logic cell is a beginning logic cell of the circuit.

27. A method as defined in claim 17, further comprising the steps of:
    displaying a schematic diagram of the selected and predictive logic cells identified from all of the repetitions; and
    displaying the input and output waveforms of the selected and predictive logic cells identified from the all of the repetitions.

28. A method as defined in claim 27, further comprising the steps of:
    displaying a schematic diagram of the identified selected and predictive logic cells by using a conventional schematic viewing tool; and
    displaying the identified input and output waveforms by using a conventional waveform viewing tool.

* * * * *